United States Patent
Mishra

(10) Patent No.: US 7,863,068 B2
(45) Date of Patent: Jan. 4, 2011

(54) METHOD FOR MAKING A LIGHT EMITTING DIODE HAVING A P-N JUNCTION DOPED WITH ONE OR MORE LUMINESCENT ACTIVATOR IONS

(75) Inventor: Kailash C. Mishra, North Chelmsford, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 84 days.

(21) Appl. No.: 12/111,380

(22) Filed: Apr. 29, 2008

(65) Prior Publication Data

US 2008/0226903 A1  Sep. 18, 2008

Related U.S. Application Data

(63) Continuation of application No. 11/161,403, filed on Aug. 2, 2005, now abandoned.

(60) Provisional application No. 60/601,382, filed on Aug. 13, 2004.

(51) Int. Cl.
*H01L 31/00* (2006.01)
*H01L 31/055* (2006.01)

(52) U.S. Cl. ............... 438/45; 438/22; 438/16; 438/29; 438/46; 257/E33.054; 257/E33.061

(58) Field of Classification Search ............ 438/46, 438/22, 16, 29, 45, 4, E33.054, E33.061; 313/503
See application file for complete search history.

(56) References Cited

U.S. PATENT DOCUMENTS

| | | | |
|---|---|---|---|
| 5,751,021 A | 5/1998 | Teraguchi | |
| 5,777,350 A | 7/1998 | Nakamura et al. | |
| 2002/0139968 A1* | 10/2002 | Kondo et al. | 257/10 |

OTHER PUBLICATIONS

M. Pan and A. J. Steck, "Red emission from Eu-doped GaN luminescent films grown by metalorganic chemical vapor deposition," Applied Physics Letter, vol. 93 No. 1, Jul. 7, 2003.*

A.J.Steckl et al., Multiple color capability from rare-earth doped gallium nitride, Materials Science and Engineering BS1 (2001) 97-101.

(Continued)

*Primary Examiner*—Ngan Ngo
*Assistant Examiner*—Benjamin Tzu-Hung Liu
(74) *Attorney, Agent, or Firm*—Robert F. Clark

(57) ABSTRACT

A light emitting diode (LED) includes a p-n junction containing luminescent activator ions. The visible emission from the activator ions preferably complementing the band edge emission of the LED in order to produce an overall white emission from the LED. In a preferred embodiment, the LED has double heterojunction structure having a semiconductor active layer between two confinement layers. The semiconductor active layer includes activator ions preferably selected from among $Eu^{3+}$, $Tb^{3+}$, $Dy^{3+}$, $Pr^{3+}$, $Tm^{3+}$, and $Mn^{2+}$. The electron-hole pairs trapped within the active layer sensitize the activator ions, causing the activator ions to emit light.

5 Claims, 2 Drawing Sheets

OTHER PUBLICATIONS

R. Garcia et al., A novel method for the synthesis of sub-microcrystalline wurtzite-type InxGa1-xN powders, Materials Science and Engineering, B90 (2002) 7-12.

Abstract, JP2005340231.

E. Schubert, Light Emitting Diodes, Cambridge University Press (2003) 166-167.

J. Berowitz et al., Investigation of luminescent materials under ultraviolet energies from 5 to 25 eV, J. Lumin., 50 (1991) 111-121.

G. Hirata et al., A New Combustion Synthesis Method for GaN:Eu3+ and Ga2O3:Eu3+ Luminescent Powders, Phys. Stat. Sol. (a), 188, No. 1 (2001) 179-182.

D. Dexter, A Theory of Sensitized Luminescence in Solids, J. Chem. Phys., 21, No. 5 (1953) 836-850.

M. Pan et al., Red Emission from Eu-doped GaN luminescent films grown by metalorganic chemical vapor deposition, App. Phys. Lett., 83, No. 1 (2003) 9-11.

* cited by examiner

METHOD FOR MAKING A LIGHT EMITTING DIODE HAVING A P-N JUNCTION DOPED WITH ONE OR MORE LUMINESCENT ACTIVATOR IONS

CROSS REFERENCE TO RELATED APPLICATION

This application is a continuation of copending application Ser. No. 11/161,403, filed Aug. 2, 2005 which claims the benefit of U.S. Provisional Application No. 60/601,382, filed Aug. 13, 2004.

TECHNICAL FIELD

The present invention is directed to light emitting diodes (LEDs), and more particularly to light emitting diodes that produce a white light emission.

BACKGROUND OF THE INVENTION

Solid state lighting uses several approaches to produce white light. The color mixing approach combines the red, green and blue emissions from three monochromatic LEDs to produce white light. Since each monochromatic LED light source can have high internal quantum efficiency, such a device could generate white light at a relatively high lumens per watt. However, the space needed for three LEDs can be burdensome and the packaging to place them together is cumbersome. The wavelength conversion approach uses ultraviolet (UV) emitting LEDs to generate UV light (generally from about 380 nm to about 420 nm) which is then converted to white light using a triblend phosphor system that is excited by the UV light. This is similar to the way white light is produced in known Hg-discharge fluorescent lamps. However, most conventional photoluminescent phosphors are optimized for excitation by the 254 nm radiation emitted by mercury discharges and not the longer wavelength UV radiation of LEDs. Additional work remains to develop a full range of phosphors for use with UV-emitting LEDs. The third approach is a hybrid in which a blue emission is provided by a GaInN LED and part of the blue emission is converted to a complementary emission by a phosphor. White light sources based on this design have been developed using a broad band emitter, in particular, cerium-activated yttrium aluminum garnet, $Y_3Al_5O_{12}:Ce^{3+}$ ($YAG:Ce^{3+}$). This design avoids the large Stokes shift associated with a higher energy UV photon at 380 nm being converted to a visible photon. A similar design has been proposed which uses a second semiconducting layer, known as passive layer, that partly converts the emission from InGaN at 450 nm to a red photon near 620 nm with a InGaP alloy. This is essentially a double heterojunction structure with InGaN as the active layer and InGaP as the passive layer; InGaP acts as a phosphor.

Phosphors in lighting devices present various engineering problems, such as lack of stability, degradation in the epoxy dome, coating uniformity, and scattering of visible light, all of which can be avoided if the lighting device does not include phosphors. As used, herein the term phosphor refers to photoluminescent materials, i.e., materials that convert photons of one energy to photons of a different energy.

SUMMARY OF THE INVENTION

An object of the present invention is to provide a novel phosphor-less light emitting diode (LED) that avoids the problems of the prior art.

A further object of the present invention is to provide a novel light emitting diode that emits white light and does not include phosphors.

A yet further object of the present invention is to provide a novel light emitting diode having a junction of p-type semiconductor material and an n-type semiconductor material wherein the junction is doped to contain one or more activator ions that produce a visible light emission when the light emitting diode is forward biased. Preferably, the LED includes a layer of a nitride-based semiconductor alloy of AlN, GaN, and InN having a band edge emission in the visible spectrum, and activator ions that have an emission spectra in the visible spectrum that complements the band edge emission so as to produce a white light emission from the LED.

Another object of the present invention is to provide a novel LED that includes a double heterojunction having a semiconductor active layer between two confinement layers, wherein the semiconductor active layer contains one or more activator ions. Preferably, the semiconductor active layer includes a film of AlGaInN having activator ions selected from among $Eu^{3+}$, $Tb^{3+}$, $Dy^{3+}$, $Pr^{3+}$, $Tm^{3+}$, and $Mn^{2+}$. More preferably, the AlGaInN film has a band edge emission in the visible/UV spectrum and the activator ions have an emission spectra in the visible spectrum that complements/converts the band edge emission of the AlGaInN film so as to produce a white light emission from the LED.

A still further object of the present invention is to provide a novel composition that includes AlGaInN having therein ions selected from the group consisting of $Eu^{3+}$, $Tb^{3+}$, $Dy^{3+}$, $Pr^{3+}$, $Tm^{3+}$, and $Mn^{2+}$.

These and other objects and advantages of the invention will be apparent to those of skill in the art of the present invention after consideration of the following drawings and description of preferred embodiments.

DETAILED DESCRIPTION OF THE INVENTION

Figure 1:
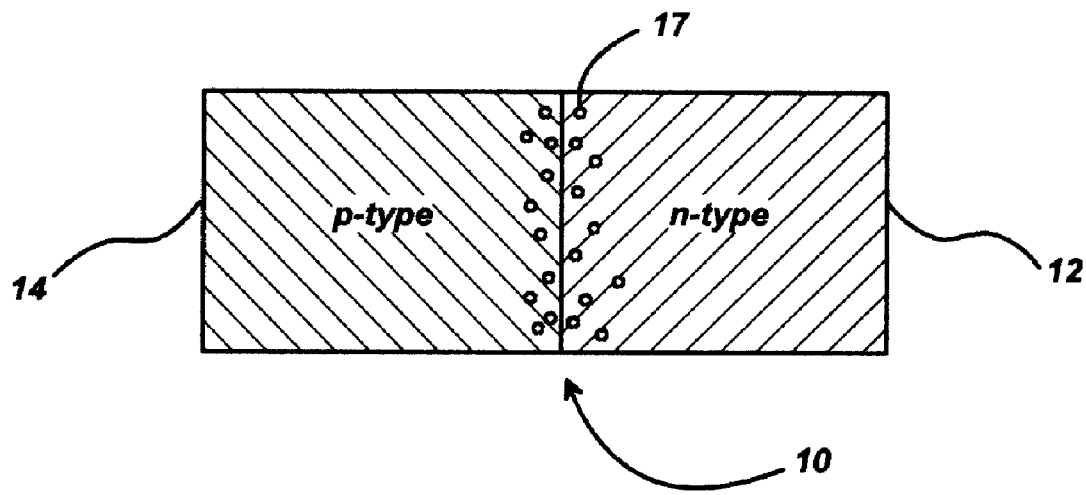
FIG. 1 is a pictorial representation of a p-n junction of an LED according to this invention.

An embodiment of the present invention is a light emitting diode that contains a junction of a p-type semiconductor material and a n-type semiconductor material wherein the junction has been doped with one or more luminescent activator ions that are stimulated to emit a visible light emission by a non-radiative energy transfer from the electron-hole pairs. The p-n junction of an LED according to this invention is shown in FIG. 1. A layer of n-type semiconductor material 12 is joined to a layer of p-type semiconductor material 14. The p-n junction 10 is doped with activator ions 17. Either or both semiconductor materials may contain the activator ions as shown in FIG. 1. The activator ions may also be present only in the junction or throughout the bulk material.

Figure 2:
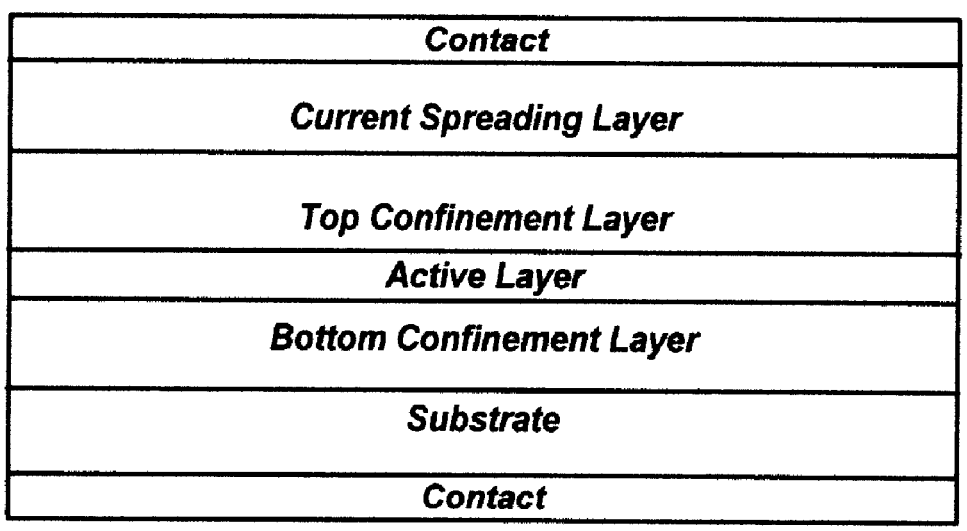
FIG. 2 is a pictorial representation of a cross section of a preferred embodiment of the present invention.

Preferably, the LED includes one or more layers of a semiconductor material selected from GaN, AlN, InN, or an alloy thereof, and suitably chosen activator ions to produce white light. In a preferred embodiment, the activator ions include one or more types of ions whose emission spectra, when superposed on the band edge (intrinsic) emission of the semiconductor material will lead to white light emission with high efficacy and color rendering index. As will be explained below, the activator ions in the p-n junction are excited by a non-radiative energy transfer from the electron-hole (e-h) pairs. In a more preferred embodiment, the layer is an active region of a double heterojunction structure in a LED that produces white light, such as shown in FIG. 2. The active region is between two carrier confinement (cladding) layers.

Non-radiative energy transfer from the e-h pairs to the activator ions is engineered by matching the band edge emission of the semiconductor material with the excitation peaks of the activator ions. The band edge emission of the semiconductor materials depends on their composition, and the excitation peaks of the activator ions depend on the crystal fields at the activator sites. The latter may be obtained from observing the excitation spectra of activator ions in semiconductor materials, in particular wide-gap, nitride-based semiconductor materials. A semiconductor composition can then be developed so that its band edge emission overlaps with the appropriate excitation peaks near the band edge.

Figure 3:
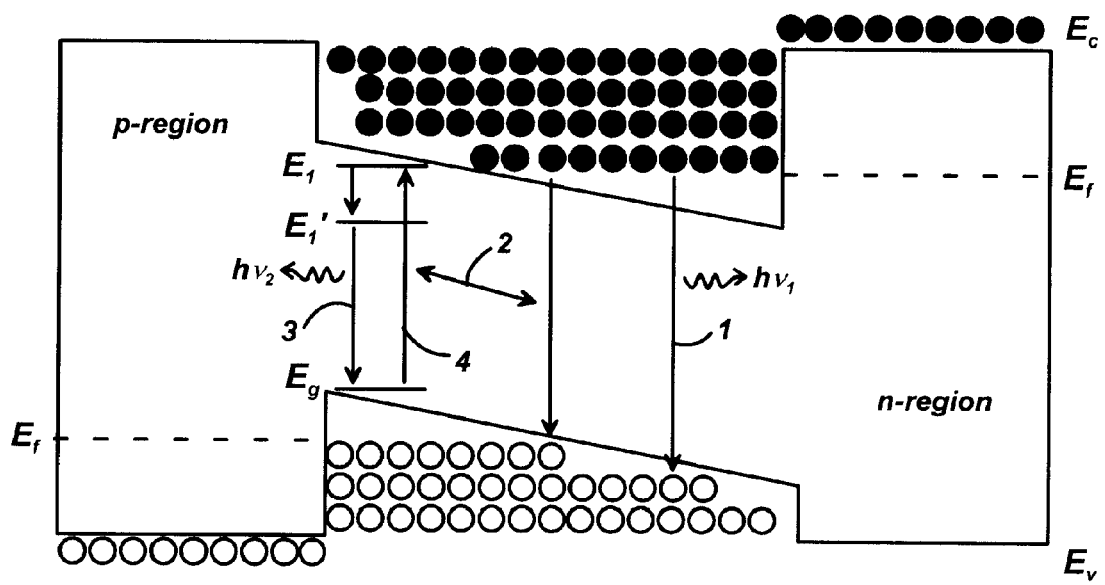
FIG. 3 is a stylized depiction of the movement of electron-hole pairs in the present invention.

In the case of the embodiment shown in FIG. 2, the active layer sandwiched between the two confinement layers converts the electron and holes injected into this region to white light. The underlying electronic processes are shown in FIG. 3. The filled circles represent electrons and the open circles represent holes. $E_c$ denotes the conduction band, $E_f$ the Fermi levels of the materials and $E_v$ the conduction band. Preferably, part of the emission of the stacked layers shown in FIG. 2 is the characteristic band edge emission ($h\nu_1$) derived from a radiative re-combination of an e-h pair as shown by arrow 1 in FIG. 3. The other part of the emission is generated by activator ions sensitized by a non-radiative energy transfer from e-h pair recombination as shown by arrow 2. The transferred energy excites the activator to a first excited state $E_1$ (arrow 4) which then may decay non-radiatively to a second excited state $E_1'$. The intermediate excited state $E_1'$ then further decays to the ground state of the activator, Eg, by a radiative transition (arrow 3) and emits a visible photon, $h\nu_2$.

In another embodiment, the LED is engineered such that the band edge emission occurs in the blue region of the visible spectrum (preferably about 420 nm to about 490 nm) and the activators ions are chosen so that their visible emissions combine with the blue band edge emission to produce an overall white emission from the LED. Alternatively, the LED is engineered such that the band edge emission occurs at an ultraviolet wavelength and the activator ions are selected to produce a combined white emission. In this case, different activator ions may produce a red emission, a green emission, and a blue emission respectively. While some of the emitted UV radiation from the band edge emission may be subsequently converted to visible light by the addition of a phosphor layer, it is preferred that the materials be engineered such that the energy from the e-h pair re-combinations is more effectively transferred to the activator ions and the number of radiative re-combinations is minimized.

The theoretical basis of the present invention may be understood by the following discussion of the principles of the physical processes of LEDs and phosphors.

LEDs are known to have high internal radiative transition probabilities. In semiconductors, emission from e-h pairs occurs almost near the band edge with insignificant Stokes shift. The radiative re-combination of the e-h pairs results in the emission of a narrow band spectrum with a full width at half maximum (FWHM) of about 5-10 nm. High quantum efficiency for e-h pair-to-photon conversion can be achieved in two different ways; enhancing the radiative recombination probability and reducing the non-radiative processes. Lifetime measurements show that the radiative recombination rate increases with increasing free carrier concentration. This is facilitated by a double heterojunction LED design in which the active layer is confined by two confinement layers with large band gaps. The spatial variation of energy bands across the heterojunctions is shown in FIG. 3. Under forward bias, the majority carriers from the p- and n-type confinement layers diffuse to the active layer, and are trapped within this layer because of the potential barrier due to the difference in band gaps. The spatial confinement of the e-h pairs enhances the probability of recombination. Thus, by suitable choice of the width of the active layer, the free carrier densities can be enhanced to an optimum level.

Double heterojunctions are employed in two different modes: bulk mode or quantum well mode. A preferred embodiment of the present invention uses the bulk mode. The active layer is typically between 0.15-0.75 μm thick. If the layer is too thick the advantage of confinement is lost, and if the layer is too thin carrier spillover may occur, both of which contribute negatively to the efficacy of a solid state lighting source.

Two observations from phosphor physics also facilitate an understanding of the present invention. First, most phosphors that (1) have high quantum efficiency when the activator ions are excited directly and (2) exhibit efficient band edge fluorescence will usually also have a high quantum efficiency near the band edge. For example, as noted in "A New Combustion Synthesis Method for GaN:$Eu^{3+}$ and $Ga_2O_3$:$Eu^{3+}$ Luminescent Powders", G. A. Hirata, F. Ramos, R. Garcia, E. J. Bosze, J. McKittrick, O. Contreras and F. A. Ponce, Phys. Stat. Sol., (A) 188, 179 (2001), $Eu^{3+}$ ions fluoresce efficiently in GaN, although the exact mechanism of cathode luminescence of $Eu^{3+}$ was not explored.

The second observation from phosphor physics is that sensitization by directly exciting the host lattice is known. In the case of photo-stimulated luminescence (PSL), host lattice absorption is usually strong, and energy transfer could be very efficient. The exact nature of sensitization is not well understood and is subject of considerable interest in generating a luminescent active layer. The process of sensitization by the host is believed to proceed through the emission from a self-trapped exciton. If the emission band due to a self-trapped exciton (STE) has a good overlap with the excitation peak of the emitting ion, the host can serve as a good sensitizer. However, there are at least two drawbacks associated with this approach: the STE emission occurs at considerably lower energies than the absorption due to a large Stokes shift, and the non-radiative transitions due to trapping of free e-h pairs prior to the formation of a self-trapped exciton. The latter is not of serious concern, since over the years LED technology has evolved to where LED chips are made with significantly fewer microscopic and macroscopic faults as evidenced in high internal quantum efficiency of LEDs. In the case of the former, LED materials are known for small Stokes shift.

The feasibility of incorporating activator ions directly into the semiconductor material for use in an LED may be evaluated empirically. It is not necessary to test the candidate materials in an actual LED. When a material is excited near or above the band edge, e-h pairs are also created within the host lattice. Emission from the activator ions will occur if non-radiative energy transfer from the e-h pairs to the activator ions occurs efficiently. Thus, it should be possible to screen candidate materials before integrating an activator-doped semiconductor layer in an actual LED design.

The material of the present application is based on the established theory of energy transfer and sensitization of the activator ions by host sensitization. Sensitization refers to a process of energy transfer from one excited ion to another via a non-radiative path. In many fluorescent materials, sensitization of the activator ion is necessary for better absorption of the exciting radiation. For example, in the green-emitting LaPO$_4$ phosphor activated by Tb$^{3+}$, Ce$^{3+}$ ions are incorporated into the lattice for an efficient absorption of the 254 nm radiation from a Hg-discharge. The first allowed absorption band of Tb$^{3+}$ corresponding to the 4f$^8$→4f$^7$5d transition lies at too high an energy level to make 254 nm excitation effective. For this purpose, Ce$^{3+}$ is a suitable sensitizer ion whose 4f→5d transition band overlaps the 254 nm emission from the discharge.

The energy transfer to the activator ions in the present invention (FIG. 3, arrow 2) is essentially an electron-electron correlation process. The theory of energy transfer by multipole-multipole interactions or exchange interaction electrons located at two different ions was initially formulated by, among others, Dexter in "A Theory of Sensitized Luminescence in Solids," J. Chem. Phys. 21, 836 (1953). An important component of the sensitization process is the transfer rate since it must compete with the radiative relaxation rate of the sensitizer. In the case of GaN, the lifetime of e-h pairs is on the order of 10$^{-8}$ s. The radiative rate is typically 10$^3$ to 10$^6$ s$^{-1}$ for the 4f→4f transitions. The dipole-dipole transfer rate between a rare-earth ion and an e-h pair can be written in terms of the oscillator strengths of the optical transition connecting the initial and final states of the cross relaxation. This is expressed as $P_{AB}^{dd}=(2/3)(2\pi/\hbar)(e^2/R^3)^2(3\hbar/2m_e)^2(1/\omega)^2 f_A f_B S$ where $\omega$ is the transition frequency on each ion involved in the cross relaxation, $f_A$ and $f_B$ are the oscillator strengths of the transitions for the rare earth ion and the e-h pair respectively, and S is the overlap of the these two transitions. Putting in values for the constants and expressing the transition energy, $\Delta E = \hbar\omega$, in eV, the overlap integral in cm$^{-1}$, and the ion-ion separation in angstroms, the transition rate can be shown to be $$P_{AB}^{dd}=1.4\times10^{24}(f_A f_B S)/(\Delta E^2 R^6).$$

For typical f-f oscillator strengths of 10$^{-6}$, an estimated oscillator strength of an e-h pair in GaN is about 10$^{-2}$, the transition energy is about 3 eV, and has a perfect overlap of transitions whose widths at room temperature are 10 cm$^{-1}$. This yields, for ions separated by a typical nearest neighbor distance of 2.0 Å, a transition rate of ~10$^{14}$ s$^{-1}$. At this rate, the radiative recombination of e-h pairs will not be able to compete with energy transfer to activator ions. This is reassuring since this confirms the expectation that a rare earth ion can be excited by the energy transfer process from the e-h pairs in the host-lattice. It is most likely the reason why emission from Eu$^{3+}$ was observed from a GaN host by Hirata et al.

Using spectroscopic data from the literature, the preferred activator ions were determined to be Eu$^{3+}$, Tb$^{3+}$, Dy$^{3+}$, Pr$^{3+}$, Tm$^{3+}$ and Mn$^{2+}$ ions. Eu$^{3+}$ and Tb$^{3+}$ are well known red and green emitters, Tm$^{3+}$ is a blue emitter, and Dy$^{3+}$ has been used to emit blue and yellow in YVO$_4$. The table below summarizes emission characteristics of these ions.

| Ion | Initial State | Final State | Emission Color |
|---|---|---|---|
| Eu$^{3+}$ | $^5D_0$ | $^7F_2$ | Orange (612 nm) |
| Tb$^{3+}$ | $^5D_4$ | $^7F_j$ | Green-yellow (550 nm) |
| Dy$^{3+}$ | $^4F_{9/2}$ | $^6H_{15/2}$ | Blue (470 nm) |
|  |  | $^6H_{13/2}$ | Yellow (570 nm) |
| Tm$^{3+}$ | $^1G_4$ | $^3H_j$ | Blue-green (480) |
| Mn$^{2+}$ | $^4T_1$ | $^6A_1$ | Green-red (host sensitive) |

As explained above, the present invention does not use phosphors to develop white light, and thus above-mentioned problems associated with phosphors are avoided, as well as the problems of the color mixing, wavelength conversion, and hybrid approaches discussed previously.

A particular embodiment of the present invention is a light emitting device that has a double heterojunction having a semiconductor active layer between two confinement layers, where the semiconductor active layer includes a film of AlGaInN having therein activator ions selected from among Eu$^{3+}$, Tb$^{3+}$, Dy$^{3+}$, Pr$^{3+}$, Tm$^{3+}$, and Mn$^{2+}$. The AlGaInN film has a band edge emission in the visible spectrum and the activator ions have an emission spectra in the visible spectrum that complements the band edge emission of the AlGaInN film so as to produce a white light emission from the device. The film may be 0.15 to 0.75 µm thick. The confinement layers may be conventional n- and p-type layers as is known in the art. The film preferably emits a blue light, and in this event the ions may be selected to emit green and red light (e.g., Eu$^{3+}$, Tb$^{3+}$). Alternately, the band edge emission could be in the ultraviolet and the activator ions chosen to emit red, green and blue light so as to produce a white light emission from the LED.

As discussed above, the semiconductor material and activator ions may be engineered so that the phosphor-less lighting device emits white light, which is a particular advantage. However, it will be appreciated that the materials also can be engineered by selectively varying the semiconductor material and/or activator ions so that the lighting device emits a particular color other than white.

A further embodiment of the present invention is a composition that includes AlGaInN having therein ions selected from among Eu$^{3+}$, Tb$^{3+}$, Dy$^{3+}$, Pr$^{3+}$, Tm$^{3+}$, and Mn$^{2+}$. More preferably, the ions include Eu$^{3+}$ and Tb$^{3+}$.

While embodiments of the present invention have been described in the foregoing specification and drawings, it is to be understood that the present invention is defined by the following claims when read in light of the specification and drawings.

What is claimed is:

1. A method for making a light emitting diode having a P-N junction doped with a luminescent activator ion, comprising the steps of:
   (a) observing an excitation spectrum of the luminescent activator ion in a wide-gap, nitride-based semiconductor material;
   (b) formulating a semiconductor composition to have a band edge emission that overlaps a selected excitation peak of the luminescent activator ion, the semiconductor composition being selected from AlN, GaN, InN and alloys thereof; and
   (c) doping the semiconductor composition with the luminescent activator ion to form the P-N junction of the light emitting diode.

2. The method of claim 1 wherein the wide-gap, nitride-based semiconductor material is GaN.

3. The method of claim 2 wherein the luminescent activator ion is selected from the group of ions consisting of Eu$^{3+}$, Tb$^{3+}$, Dy$^{3+}$, Pr$^{3+}$, Tm$^{3+}$, and Mn$^{2+}$.

4. The method of claim 1 wherein the luminescent activator ion is selected from the group of ions consisting of Eu$^{3+}$, Tb$^{3+}$, Dy$^{3+}$, Pr$^{3+}$, Tm$^{3+}$, and Mn$^{2+}$.

5. The method of claim 1 wherein the P-N junction is doped with more than one luminescent activator ion.

\* \* \* \* \*